US007750717B2

(12) United States Patent  
Ali et al.

(10) Patent No.: US 7,750,717 B2  
(45) Date of Patent: Jul. 6, 2010

(54) SINGLE SUPPLY LEVEL SHIFTER CIRCUIT FOR MULTI-VOLTAGE DESIGNS, CAPABLE OF UP/DOWN SHIFTING

(75) Inventors: Shahid Ali, Bangalore (IN); Sujan Manohar, Kundapur (IN)

(73) Assignee: Texas Instruments Incorporated, Dallas, TX (US)

( * ) Notice: Subject to any disclaimer, the term of this patent is extended or adjusted under 35 U.S.C. 154(b) by 40 days.

(21) Appl. No.: 12/179,616

(22) Filed: Jul. 25, 2008

(65) Prior Publication Data

US 2010/0019825 A1 Jan. 28, 2010

(51) Int. Cl.  
*H03L 5/00* (2006.01)

(52) U.S. Cl. .......................... 327/333; 326/63; 326/81

(58) Field of Classification Search ............ 326/62–63, 326/80–81; 327/306, 333  
See application file for complete search history.

(56) References Cited

U.S. PATENT DOCUMENTS

| 5,587,679 | A  | * | 12/1996 | Imamura ............. 327/170 |
| 7,113,017 | B2 | * | 9/2006  | Owen ................. 327/333 |
| 7,199,617 | B1 | * | 4/2007  | Schrom et al. ......... 326/86 |
| 7,375,574 | B2 | * | 5/2008  | Kanno et al. .......... 327/333 |
| 7,511,552 | B2 | * | 3/2009  | Ali et al. ............ 327/333 |

* cited by examiner

*Primary Examiner*—Dinh T. Le  
(74) *Attorney, Agent, or Firm*—Dawn V. Stephens; Wade James Brady, III; Frederick J. Telecky, Jr.

(57) ABSTRACT

A method, system, and apparatus to a novel single supply level shifter circuit for multi-voltage designs, capable of up/down shifting are disclosed. In one embodiment, a system includes a first circuit, a second circuit, a voltage source with an output voltage equal to a voltage value of the second circuit, a level shifter circuit coupled with both an output of the first circuit and an output of the voltage source and wherein the level shifter circuit is used to convert a voltage value of a signal from the first circuit to the voltage value of the second circuit, and a capacitor loop circuit associated with the first circuit, the level shifter circuit and the voltage source and configured with a capacitor to charge from at least one of a first circuit output voltage.

18 Claims, 7 Drawing Sheets

US 7,750,717 B2

SINGLE SUPPLY LEVEL SHIFTER CIRCUIT FOR MULTI-VOLTAGE DESIGNS, CAPABLE OF UP/DOWN SHIFTING

FIELD OF TECHNOLOGY

This disclosure relates generally to an enterprise method, a technical field of software and/or hardware technology and, in one example embodiment, to a novel single supply level shifter circuit for multi-voltage designs, capable of up/down shifting

BACKGROUND

A semiconductor integrated circuit (e.g., an electronic circuit consisting of a set of semiconductor devices and/or a set of passive components that have been located in a semiconductor material) may have a number of voltage domains (e.g., a different voltage value). The semiconductor integrated circuit may use a level shifter device (e.g., a device that converts a voltage value of a signal to an other voltage value) to interface at least two different power domains. The level shifter device may require a voltage power supply (e.g., a source of electrical power) from each voltage domain associated with the level shifter device in order to provide a power value to convert the voltage value of the signal to the other voltage value. The voltage power supply may require an electric interconnection (e.g., a pin, a metal wire coming out of an integrated circuit, transistor, interconnect, etc.) to couple to the level shifter device. The coupling of the level shifter device to a number of voltage power supplies may increase a total number of components in the semiconductor integrated circuit. This may decrease an amount of available space in the semiconductor integrated circuit. A power supply routing circuit of the semiconductor integrated circuit may also become congested (e.g., by adding more connections, etc.). Furthermore, a cost of manufacture and/or a complexity of design of the semiconductor integrated circuit may also increase.

SUMMARY

A method, system, and apparatus to a novel single supply level shifter circuit for multi-voltage designs, capable of up/down shifting are disclosed. In one aspect, a system includes a first circuit, a second circuit, a voltage source with an output voltage equal to a voltage value of the second circuit, a level shifter circuit coupled with both an output of the first circuit and an output of the voltage source and wherein the level shifter circuit is used to convert a voltage value of a signal from the first circuit to the voltage value of the second circuit, and a capacitor loop circuit associated with the first circuit, the level shifter circuit and the voltage source and configured with a capacitor to charge from at least one of a first circuit output voltage and a voltage source output voltage and to discharge into a specified node of the level shifter circuit when the output signal of the first circuit is at a logic state low.

The capacitor loop circuit may include a resistor circuit (e.g., may include resistors, transistors, capacitors, etc.) in series with a capacitor circuit. The capacitor circuit may include a p-channel metal-oxide-semiconductor field-effect transistor (MOSFET) configured to function as the capacitor and an n-channel MOSFET transistor configured to function as the capacitor. The capacitor circuit contains capacitors in parallel. The resistor circuit may be a p-channel MOSFET transistors in series configured to function as a resistor. A resistance value of the p-channel MOSFET transistors in series may be set to a specified value by scaling a width value to a length value of each of the p-channel MOSFET transistors. The resistor circuit may be an other n-channel MOSFET transistor. The voltage source may be coupled to the other n-channel MOSFET transistor in order to eliminate an unbuffered signal from the first circuit. The voltage source may be the second circuit.

The level shifter circuit may include a complementary metal-oxide-semiconductor (CMOS) inverter coupled with an other CMOS inverter and the CMOS inverter may be coupled with the first circuit and the voltage source and the other CMOS inverter is coupled with the second circuit and the voltage source. A capacitor control circuit coupled with both the capacitor loop circuit and the voltage source to charge the capacitor circuit of the capacitor loop circuit to the voltage value of the second circuit when the output signal of the first circuit may be at the logic state low.

The capacitor of the capacitor loop circuit may discharge the first circuit output voltage into the level shifter circuit when the first circuit output voltage value is higher than the second circuit voltage value. The capacitor of the capacitor loop circuit may discharge the voltage source output voltage into the level shifter when the first circuit output voltage value is less than the second circuit voltage value.

In another aspect, a method of a level shifter includes coupling a single voltage power supply to a level shifter circuit, coupling a first circuit to the level shifter circuit, using the first circuit to communicate a voltage signal to the level shifter circuit, configuring the level shifter circuit to convert a voltage value of the voltage signal to an other voltage value of a second circuit, configuring a charge holder circuit coupled to the level shifter circuit with a capacitor to charge from at least one of at least one of a first circuit output voltage and a voltage source output voltage and to discharge into a specified node of the level shifter circuit when the voltage signal is at a logic state low in order to accelerate the change of the voltage value the voltage signal to the other voltage value of the second circuit, coupling the level shifter to a second circuit, and using the level shifter circuit to communicate the voltage signal with the other voltage value to the second circuit.

The single power voltage supply may be the second circuit. The charge holder circuit may include a resistor circuit in series with a capacitor circuit. The capacitor circuit may also include a p-channel metal-oxide-semiconductor field-effect transistor (MOSFET) configured to function as the capacitor and/or an n-channel MOSFET transistor configured to function as the capacitor. The resistor circuit may be a p-channel MOSFET transistors in series configured to function as the resistor. The resistor circuit may also be an other n-channel MOSFET transistor. The second circuit may be coupled to the other n-channel MOSFET transistor located in the charge holder circuit in order to eliminate an unbuffered signal from the first circuit. The method may include discharging the capacitor into the specified node of the level shifter circuit during a ramp up phase of the level shifter circuit in order to decrease the duration of the ramp up phase.

In yet another aspect, a system of an integrated circuit includes a circuit configured to convert a voltage value of an input signal to an other voltage value of an output signal, a supply circuit associated with the circuit to provide both a single voltage power input and around voltage input into the circuit in order to power a conversion process of the voltage value of the input signal to the other voltage value of the output signal, and a charge provider circuit to store a charge and to discharge the charge into the circuit in order decrease the slew rate of the output signal of the circuit.

A charge value of the charge may be the voltage value of the input signal to the other voltage value of the output signal.

The methods, systems, and apparatuses disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

A method, system, and apparatus to a novel single supply level shifter circuit for multi-voltage designs, capable of up/down shifting are disclosed. Although the present embodiments have been described with reference to specific example embodiments, it will be evident that various modifications and changes may be made to these embodiments without departing from the broader spirit and scope of the various embodiments.

Figure 2:
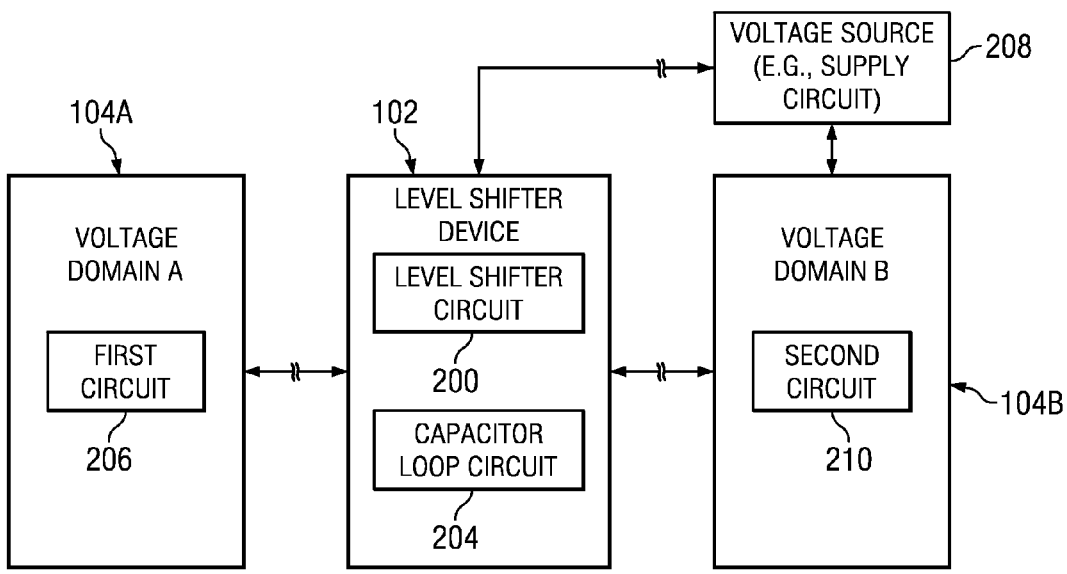
FIG. 2 is an exploded view of the level shifter device, associated with a first circuit and a second circuit, according to one embodiment.
Figure 5:
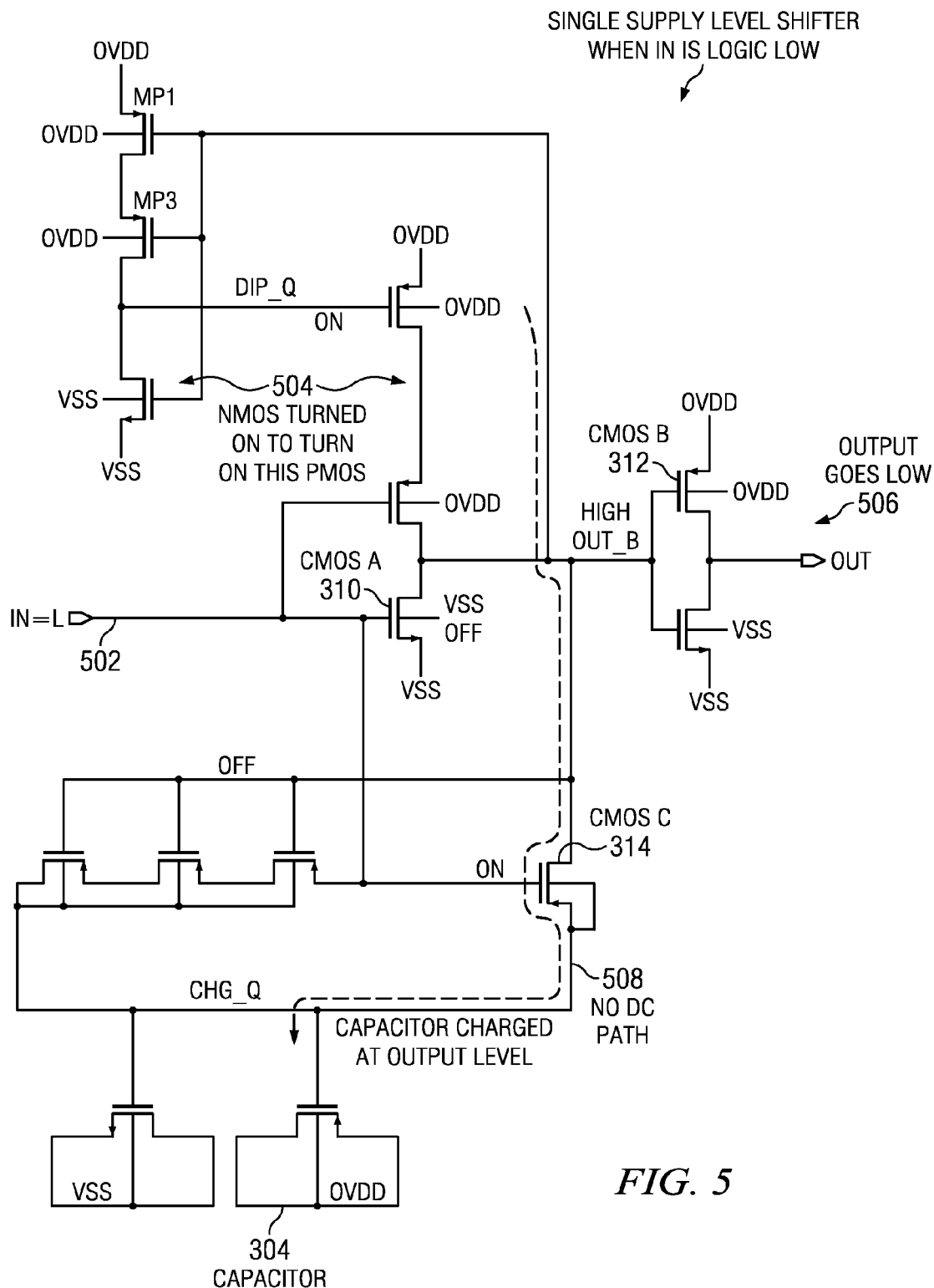
FIG. 5 is a systematic view illustrating the single supply level shifter circuit when input may be logic low, according to one embodiment.

In one embodiment, a system includes a first circuit (e.g., the first circuit 206 of FIG. 2), a second circuit (e.g., the second circuit 210 of FIG. 2), a voltage source (e.g., the voltage source 208 of FIG. 2) with an output voltage equal to a voltage value of the second circuit 210, a level shifter circuit (e.g., the level shifter circuit 200 of FIG. 2) coupled with both an output of the first circuit 206 and an output of the voltage source 208 and the level shifter circuit 200 may be used to convert a voltage value of a signal from the first circuit 206 to the voltage value of the second circuit 210 (e.g., as illustrated in FIG. 2), and a capacitor loop circuit (e.g., the capacitor loop circuit 204 of FIG. 2) associated with the first circuit 206, the level shifter circuit 200 and the voltage source 208 and configured with a capacitor (e.g., the capacitor 304 of FIG. 3) to charge from a first circuit output voltage and a voltage source output voltage and to discharge into a specified node of the level shifter circuit 200 when the output signal of the first circuit 206 is at a logic state low (e.g., as illustrated in FIG. 5).

In another embodiment, a method of a level shifter (e.g., using the level shifter circuit 200 of FIG. 2) includes coupling a single voltage power supply (e.g., the voltage source 208 of FIG. 2) to a level shifter circuit (e.g., the level shifter circuit 200 of FIG. 2), coupling a first circuit (e.g., the first circuit 206 of FIG. 2) to the level shifter circuit 200, using the first circuit 206 to communicate a voltage signal to the level shifter circuit 200, configuring the level shifter circuit 200 to convert a voltage value of the voltage signal to an other voltage value of a second circuit (e.g., the second circuit 210 of FIG. 2), configuring a charge holder circuit (e.g., the capacitor circuit 308 of FIG. 3) coupled to the level shifter circuit 200 with a capacitor (e.g., the capacitor 304 of FIG. 3) to charge a first circuit output voltage and a voltage source output voltage and to discharge into a specified node of the level shifter circuit 200 when the voltage signal is at a logic state low in order to accelerate the change of the voltage value of the voltage signal to the other voltage value of the second circuit 210 (e.g., as illustrated in FIG. 5), coupling the level shifter to a second circuit (e.g., the second circuit 210 of FIG. 2), and using the level shifter circuit 200 to communicate the voltage signal with the other voltage value to the second circuit 210.

In yet another embodiment, a system of an integrated circuit (e.g., may be the semiconductor integrated circuit 100 of FIG. 1) includes a circuit (e.g., may be the first circuit 206, the second circuit 210, and/or a level shifter circuit 200, etc.) configured to convert a voltage value of an input signal to an other voltage value of an output signal, a supply circuit (e.g., the voltage source 208 of FIG. 2) associated with the circuit to provide both a single voltage power input and around voltage input into the circuit in order to power a conversion process of the voltage value of the input signal to the other voltage value of the output signal, and a charge provider circuit (e.g., the capacitor circuit 308 of FIG. 3) to store a charge and to discharge the charge into the circuit (e.g., may be by using a capacitor 304 of FIG. 3) in order decrease the slew rate (e.g., the rate of change of a signal at any point in a circuit) of the output signal of the circuit.

Figure 1:
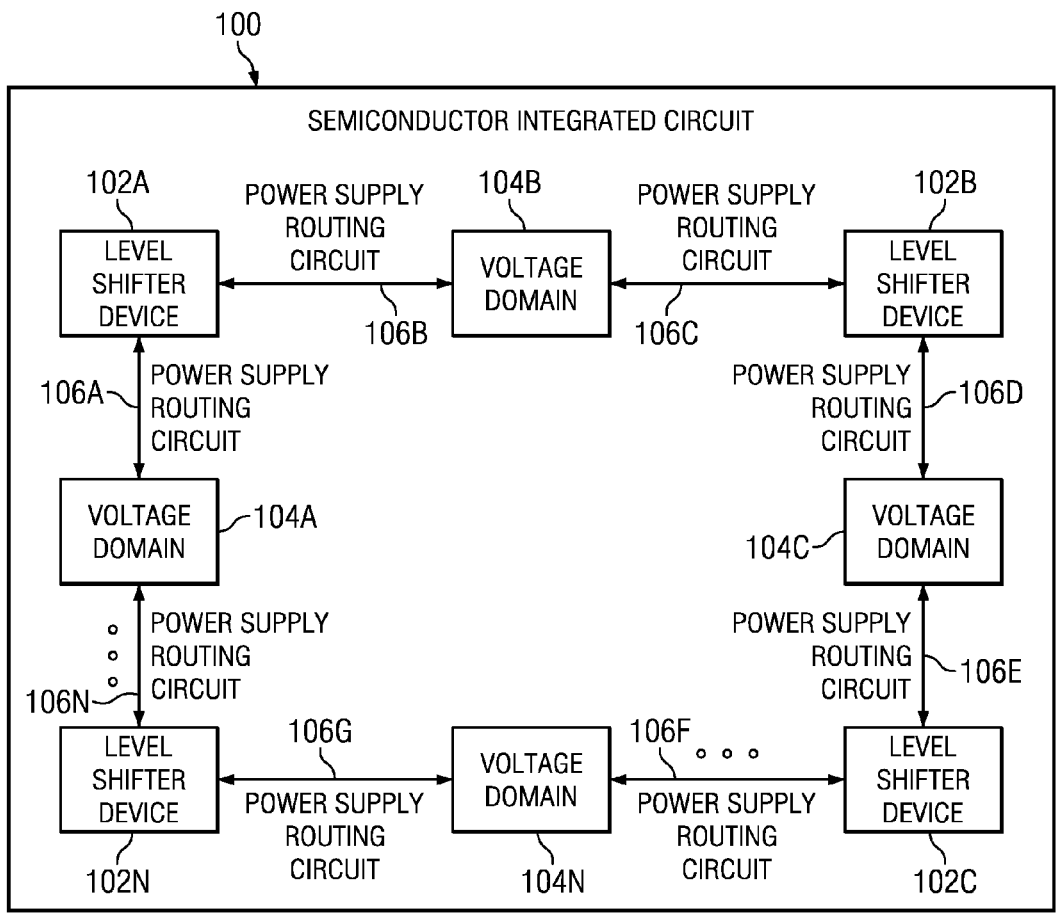
FIG. 1 is a system view of a semiconductor integrated circuit that includes a level shifter device, and a voltage domain, according to one embodiment.

FIG. 1 is a system view of a semiconductor integrated circuit that includes a level shifter device, and a voltage domain, according to one embodiment. Particularly, FIG. 1 illustrates a semiconductor integrated circuit 100, a level shifter device 102A-N, a voltage domain 104A-N, and a power supply routing circuit 106A-N, according to one embodiment.

The semiconductor integrated circuit 100 (e.g., known as IC, microcircuit, microchip, chip, etc.) may be a miniaturized electronic circuit (e.g., that may include semiconductor devices, passive components, etc.) that may constructed on a thin substrate of semiconductor material (e.g., a level shifter circuit 200 of FIG. 2). The level shifter device 102A-N may be a device (e.g., may be a single supply level shifter, etc.) that may be used to shift the voltage of a signal (e.g., input) to different voltage levels (e.g., may be low to high and/or high to low without leakage current). The voltage domain 104A-N may be a circuit (e.g., may be a power supply circuit, a passive circuit, etc.) which may provide an input to the level shifter device 102A-N. The power supply routing circuit 106A-N may be a circuit (e.g., wires, interconnect, etc.) that may be used to route signal (e.g., voltage, current, power, etc.) between the circuit (e.g., the level shifter devices 102A-N).

In example embodiment, the semiconductor integrated circuit 100 may include the level shifter device 102A-N operating in the voltage domain 104A-N. The level shifter device 102A-N may operate in the voltage domain 104A-N through the power supply routing circuit 106A-N.

FIG. 2 is an exploded view of the level shifter device 102A-N, associated with the first circuit 206 and the second circuit 210, according to one embodiment. Particularly, FIG. 2 illustrates the level shifter device 102, the voltage domain 104A, the voltage domain B 104B, a level shifter circuit 200, a capacitor loop circuit 204, the first circuit 206, a voltage source 208, and the second circuit 210, according to one embodiment.

The level shifter circuit 200 may be a circuit (e.g., IC, chip, on-board circuit, etc.) that may be used to shift the signal (e.g., may be high to low and/or low to high without leakage current (e.g., a small current leaking when a MOSFET is in semi-on state in an inverter circuit in the level shifter circuit)) in circuits (e.g., may be in semiconductor integrated circuit through power supply routing circuits 106A-N, etc.). The capacitor loop circuit 204 may have resistor circuits (e.g., resistors (transistors) may be connected in series) associated with a capacitor circuit (e.g., the capacitor circuit 308 of FIG. 3) for charging and discharging the capacitors 304 (e.g., for supporting the level shifter circuit 200 through ramp-up). The first circuit 206 (e.g., power supply, etc.) of a voltage domain A 104A may supply the input (e.g., voltage, etc.) to the level shifter device 102. The voltage source 208 may provide voltage (e.g., OVDD, VSS, etc.) to the level shifter device 102. The second circuit 210 in the voltage domain B 104B may receive output (e.g., voltage, etc.) from the level shifter device 102.

In example embodiment, the level shifter device 102 that may include the level shifter circuit 200, and the capacitor loop circuit 204. The first circuit 206 of the voltage domain A 104A may be coupled to the level shifter device 102. The second circuit 210 of the voltage domain B 104B may be coupled to the level shifter device 102. The voltage source 208 coupled to the level shifter device 102 may provide input (e.g., voltage, etc.) to the level shifter device 102 and the second circuit 210.

In one embodiment, the voltage source 208 with the output voltage may be equal to the voltage value of the second circuit 210. The level shifter circuit 200 may be coupled with both the output of the first circuit 206 and/or an output of the voltage source 208. The level shifter circuit 200 may be used to convert the voltage value of the signal from the first circuit 206 to the voltage value of the second circuit 210. The capacitor loop circuit 204 may be associated with the first circuit 206, the level shifter circuit 200 and the voltage source 208 and configured with the capacitor 304 to charge from the first circuit 206 output voltage and the voltage source output voltage and to discharge into the specified node of the level shifter circuit 200 when the output signal of the first circuit 206 may be at the logic state low (e.g., as illustrated in FIG. 5).

The capacitor loop circuit 204 may include the resistor circuit 302 in series with the capacitor circuit 308. The capacitor 304 of the capacitor loop circuit 204 may discharge the first circuit output voltage into the level shifter circuit 200 when the first circuit output voltage value may be higher than the second circuit voltage value. The capacitor 304 of the capacitor loop circuit 204 may discharge the voltage source output voltage into the level shifter when the first circuit output voltage value may be less than the second circuit voltage value.

The single voltage power supply may be coupled to the level shifter circuit 200. The first circuit 206 may be coupled to the level shifter circuit 200. The first circuit 206 may be used to communicate the voltage signal to the level shifter circuit 200. The level shifter circuit 200 may be configured to convert the voltage value of the voltage signal to an other voltage value of the second circuit 210. The charge holder circuit (e.g., the capacitor circuit 308 of FIG. 3) coupled to the level shifter circuit 200 may be configured with the capacitor 304 to charge from the first circuit output voltage and the voltage source output voltage and to discharge into the specified node of the level shifter circuit 200 when the voltage signal may be at the logic state low in order to accelerate the change of the voltage value the voltage signal to the other voltage value of the second circuit 210 (e.g., as illustrated in FIG. 5). The level shifter may be coupled to the second circuit 210. The level shifter circuit 200 may be used to communicate the voltage signal with the other voltage value to the second circuit 210.

The single power voltage supply may be the second circuit 210. The voltage source 208 may be coupled to the other n-channel MOSFET transistor in order to eliminate an unbuffered signal from the first circuit 206. The voltage source 208 may be the second circuit 210. The second circuit 210 may be coupled to the other n-channel MOSFET transistor located in the charge holder circuit (e.g., may be the capacitor circuit 308 of FIG. 3) in order to eliminate an unbuffered signal from the first circuit 206.

The circuit may be configured to convert the voltage value of the input signal to an other voltage value of the output signal. The supply circuit (e.g., may be the voltage source 208 of FIG. 2) associated with the circuit may provide both the single voltage power input and the ground voltage input into the circuit in order to power the conversion process of the voltage value of the input signal to the other voltage value of the output signal. The charge provider circuit (e.g., may be a capacitor circuit 308 of FIG. 3) may store the charge and discharge the charge into the circuit in order decrease the slew rate (e.g., the rate of change of a signal at any point in a circuit) of the output signal of the circuit. The charge value of the charge may be the voltage value of the input signal to the other voltage value of the output signal.

Figure 3:
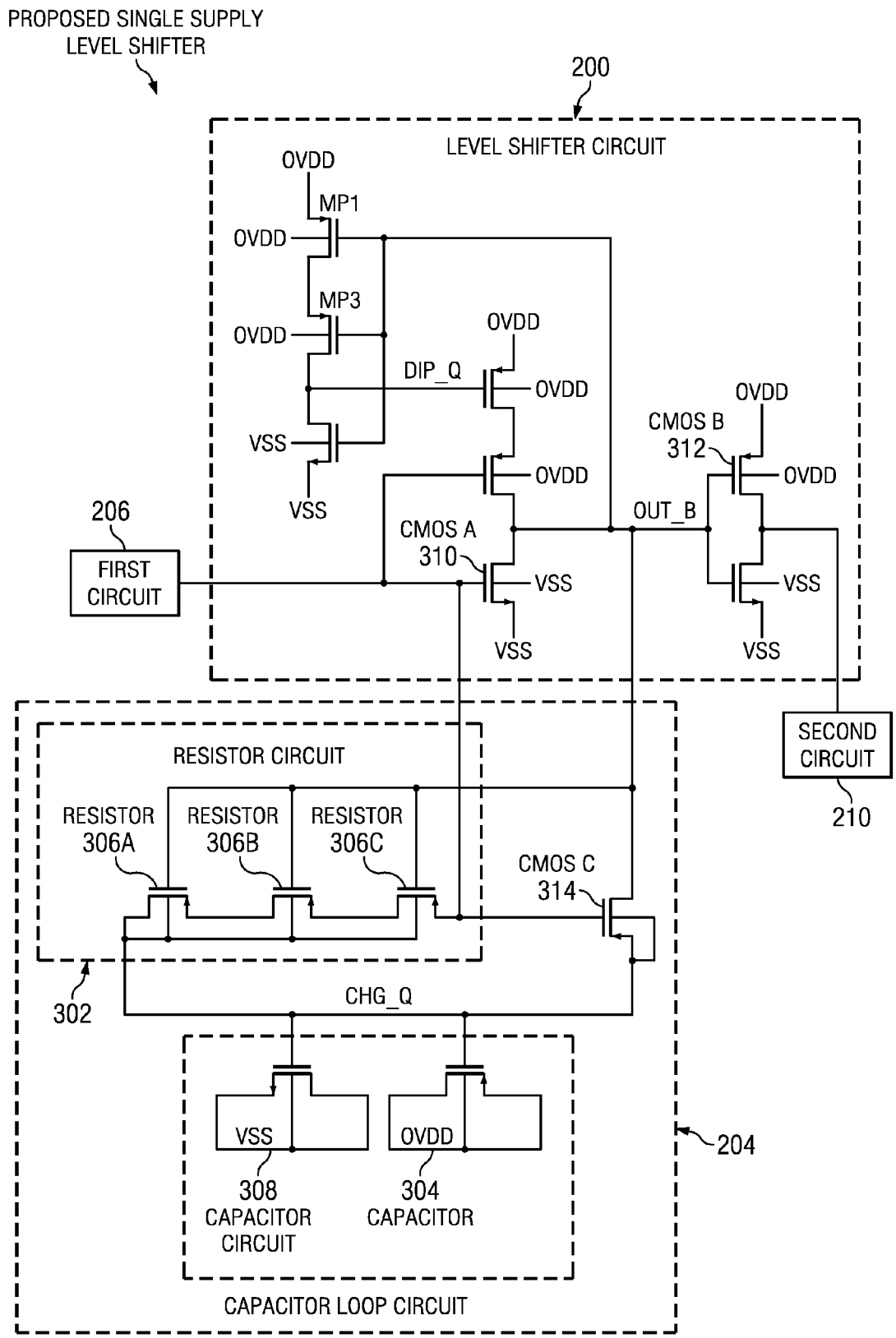
FIG. 3 is a schematic view illustrating the level shifter circuit coupled with the first circuit, and the second circuit, according to one embodiment.

FIG. 3 is a schematic view illustrating the level shifter circuit 200 coupled with the first circuit 206, and the second circuit 210, according to one embodiment. Particularly, FIG. 3 illustrates the level shifter circuit 200, the first circuit 206, the second circuit 210, a capacitor circuit 308, a resistor circuit 302, a capacitor 304, a resistor 306A-C, a CMOS A 310, a CMOS B 312, a CMOS C 314, and a OVDD voltage source 316, according to one embodiment.

The capacitor circuit 308 may be the charge holder circuit (e.g., the capacitor circuit 308 of FIG. 3 having PMOS, NMOS transistors) used to charge/discharge to a specific voltage level (e.g., may be to ramp-up). The resistor circuit 302 (e.g., may include resistors, transistors, capacitors, etc.) (e.g., N-channel MOSFET, P-channel MOSFET, etc.) may be used to isolate the charged current to the level shifter circuit 200 from the capacitor circuit 308. The resistor 306A-C may be a electrical and/or electronic component (e.g., may be the weak P-MOS transistor connected in series) used to oppose the current by producing a voltage drop between its terminals in proportion to the current.

The capacitor 304 may be an electrical and/or electronic device (e.g., may be made up of NMOS and/or PMOS transistors used to hold charge) that may store energy in the electric field between a pair of conductors (e.g., plates). The voltage source=VDD may supply voltage to transistors (e.g., PMOS in inverter circuit). The CMOS A 310 may be a transistor (e.g., PMOS, CMOS, etc.) associated with the inverter circuit (e.g., may be made up of NMOS, PMOS transistors).

The CMOS B 312 may be a transistor (e.g., PMOS, CMOS, etc.) associated with the inverter circuit. The CMOS C 314 may be a transistor (e.g., PMOS, CMOS, etc.) associated to first circuit 206

In example embodiment, the level shifter circuit 200 that may be coupled with the first circuit 206 and the second circuit 210 used to convert the voltage value of the signal. The second circuit 210 may be the output circuit that may receive output (e.g., high voltage and/or low voltage) from the level shifter circuit 200. The first circuit 206 and second circuit 210 may be coupled with the CMOS A 310, CMOS B 312, and CMOS C 314 transistors. The resistor circuit 302 may be used to isolate the capacitor circuit 308 from the level shifter circuit 200. The capacitor loop circuit 204 may be connected to the level shifter circuit 200 through resistor 306A-C.

In one embodiment, the capacitor circuit 308 may include capacitors in parallel. The resistor circuit 302 may be the other n-channel MOSFET transistor. The complementary metal-oxide-semiconductor (CMOS) inverter may be coupled with the other CMOS inverter. The CMOS inverter may be coupled with the first circuit 206 and the voltage source 208 and the other CMOS inverter may be coupled with the second circuit 210 and the voltage source 208. The capacitor control circuit may be coupled with both the capacitor loop circuit 204 and/or the voltage source 208 to charge the capacitor circuit 308 of the capacitor loop circuit 204 to the voltage value of the second circuit 210 when the output signal of the first circuit 206 may be at the logic state low (e.g., as illustrated in FIG. 5). The charge holder circuit (e.g., the capacitor circuit 308 of FIG. 3) may include the resistor circuit 302 in series with the capacitor circuit 308. The capacitor circuit 308 may include p-channel metal-oxide-semiconductor field-effect transistor (MOSFET) 700 configured to function as the capacitor 304 and the n-channel MOSFET transistor 600 configured to function as the capacitor 304. The resistor circuit 302 may be the other n-channel MOSFET transistor. The capacitor 304 may be discharged into the specified node of the level shifter circuit 200 during the ramp up phase of the level shifter circuit 200 in order to decrease the duration of the ramp up phase.

Figure 4:
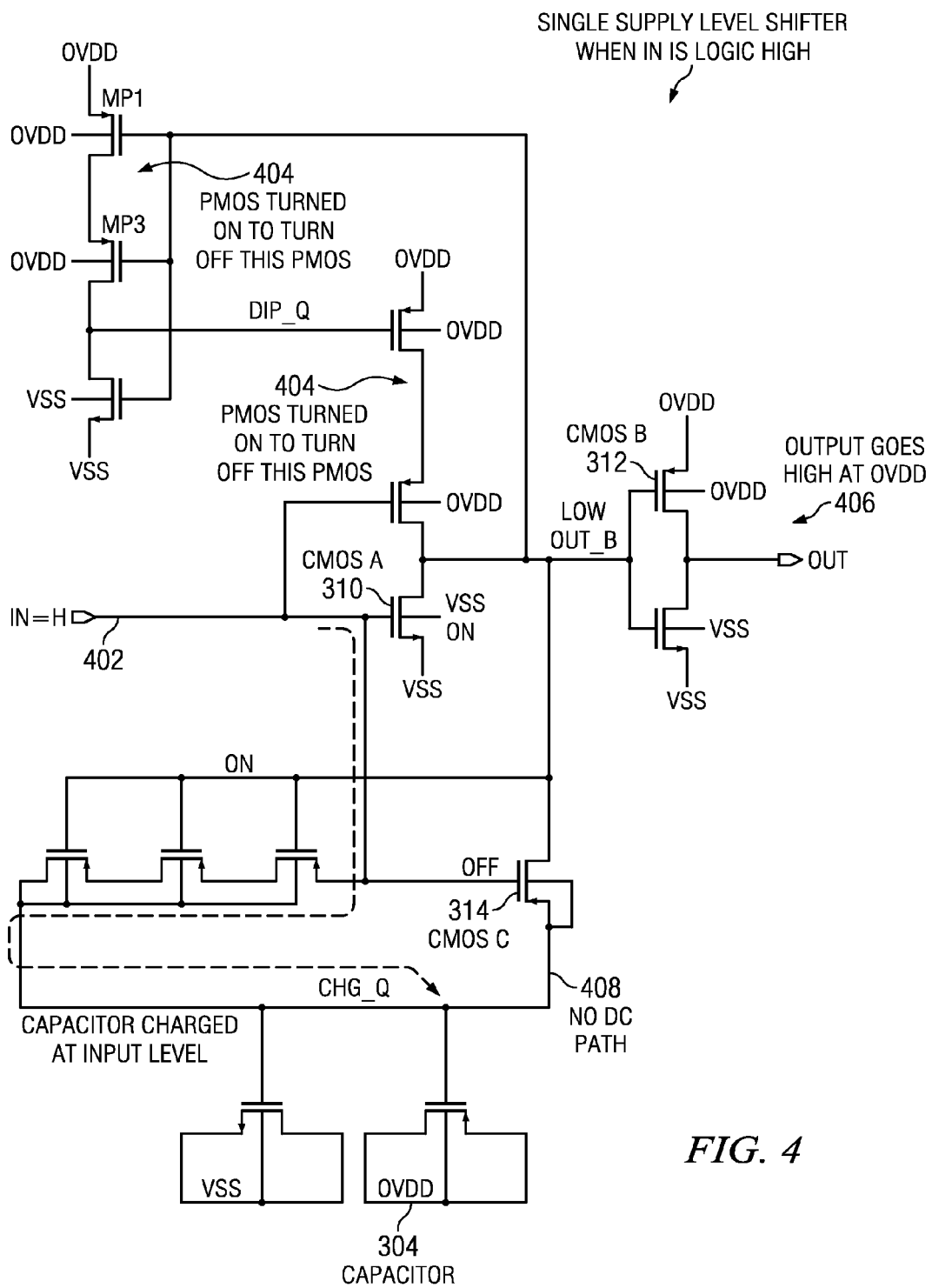
FIG. 4 is a systematic view illustrating a single supply level shifter circuit when input may be logic high, according to one embodiment.

FIG. 4 is a systematic view illustrating a single supply level shifter circuit (e.g., the level shifter circuit 200 of FIG. 2) when input may be logic high, according to one embodiment. Particularly, FIG. 4 illustrates the CMOS A 310, the CMOS B312, the CMOS C 314, a IN-H 402, a PMOS turned on to turn off this PMOS 404, an output goes high at OVDD 406, a no DC path 408, and the OVDD=voltage source 316, according to one embodiment.

The IN-H 402 may be the input value which may define high level voltage. The PMOS turned on to turn off this PMOS 404 may result in when IN-H 402 may be applied to input of the level shifter circuit 200. The output goes high at OVDD 406 when input voltage IN-H 402 may be applied to the level shifter circuit 200. The NO DC path (e.g., there may be no current flow) 408 may illustrate zero voltage difference between the nodes (e.g., wire, connect, interconnect, etc.) that may indicate no leakage current.

In example embodiment, the IN-H 402 may be the input high voltage value that may be used to turn on CMOS A 310 (e.g., the NMOS transistor) in the level shifter circuit 200 which may result in the PMOS to turn on to turn off this PMOS 404 that may result in output to go high at OVDD 406. The IN-H 402 applied may turn off the CMOS C 314 transistor and may charge the capacitor 304 through resistor circuit 302 which may result in no DC path 408 (e.g., there may be no leakage of current).

FIG. 5 is a systematic view illustrating the single supply level shifter circuit (e.g., the level shifter circuit 200 of FIG. 2) when input may be logic low, according to one embodiment. Particularly, FIG. 5 illustrates the OVDD=voltage source 316, a IN-L 502, a NMOS turned on to turn ON this PMOS 504, an output goes low 506, and no DC path 508, according to one embodiment.

The IN-L 502 may be the input low voltage value that may be used to turn off the CMOS A 310. The NMOS turned on to turn off this PMOS 504 when IN-L 502 may be applied to input of the level shifter circuit 200. The output may be low 506, when input voltage IN-L 502 is applied to the level shifter circuit 200. The no DC path 508 may illustrate zero voltage difference between the nodes (e.g., wire, connect, interconnect, etc.) that may indicate no leakage current.

In example embodiment, the IN-L 502 may be the input low voltage value that may be used to turn off CMOS A 310 in the level shifter circuit 200 which may result in NMOS to turn on to turn off this PMOS 504 that results output to go low 506. The IN-L 502 applied may turn on the CMOS C 314 transistor and may discharge the capacitor 304 through CMOS C 314 transistor which results no DC path 508.

Figure 6:
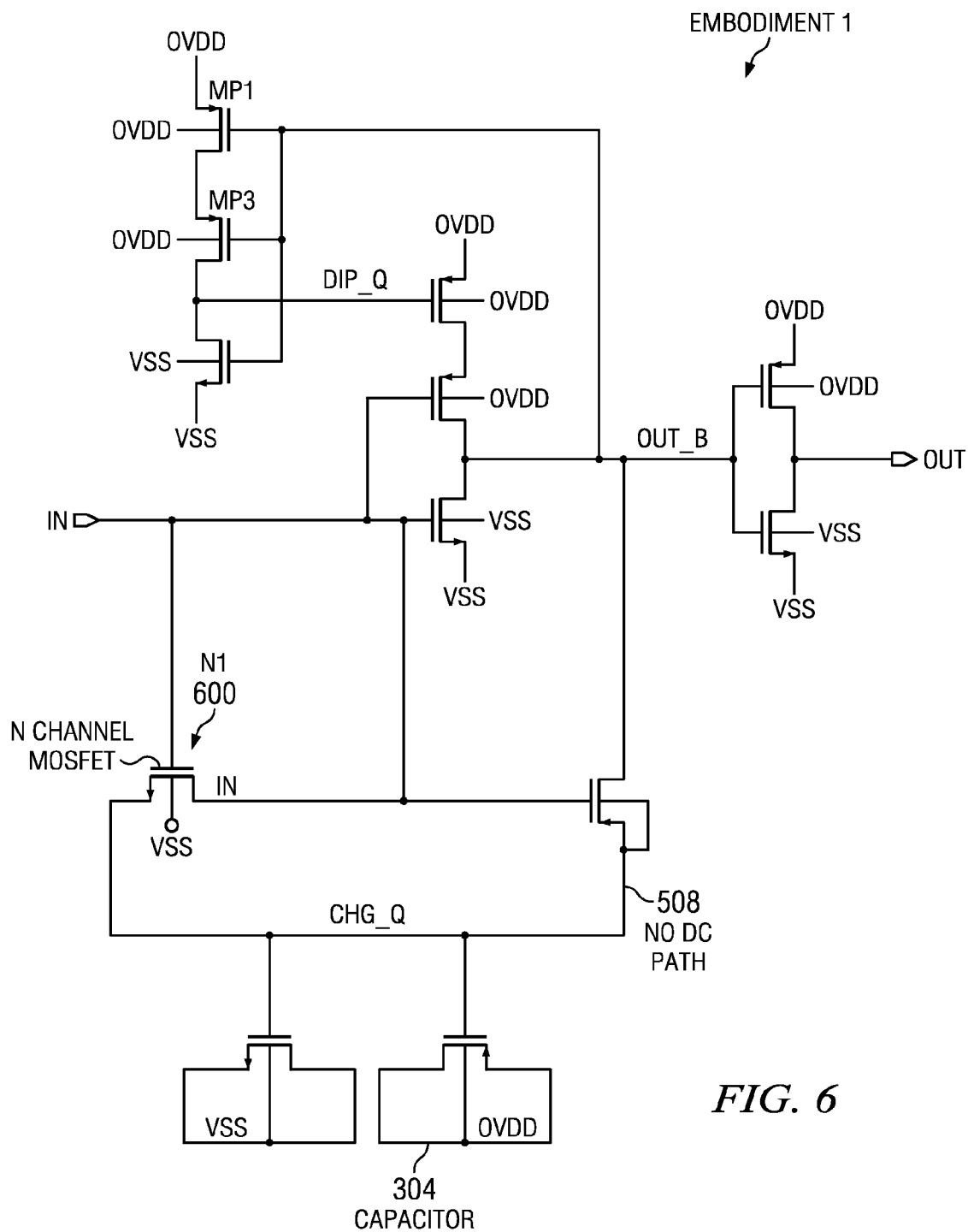
FIG. 6 is a schematic view illustrating N-channel MOSFET transistor as a resistor in the resistor circuit, according to one embodiment.

FIG. 6 is a schematic view illustrating N-channel MOSFET transistor 600 as a resistor in the resistor circuit, according to one embodiment. Particularly, FIG. 6 illustrates N-channel MOSFET transistor 600, according to one embodiment.

The N-channel MOSFET transistor 600 may be configured to function as the capacitor 304 that may be used to eliminate non-significant leakage that may be present during input switching from IN-H 402 to IN-L 502.

In example embodiment 1, FIG. 6 is same as the FIG. 3, except the N-channel MOSFET transistor 600 that may be replaced by the resistor circuit 302 from the capacitor loop circuit 204.

In one embodiment, the capacitor circuit may include the p-channel metal-oxide-semiconductor field-effect transistor (MOSFET) 700 configured to function as the capacitor and an n-channel MOSFET transistor 600 configured to function as the capacitor 304.

Figure 7:
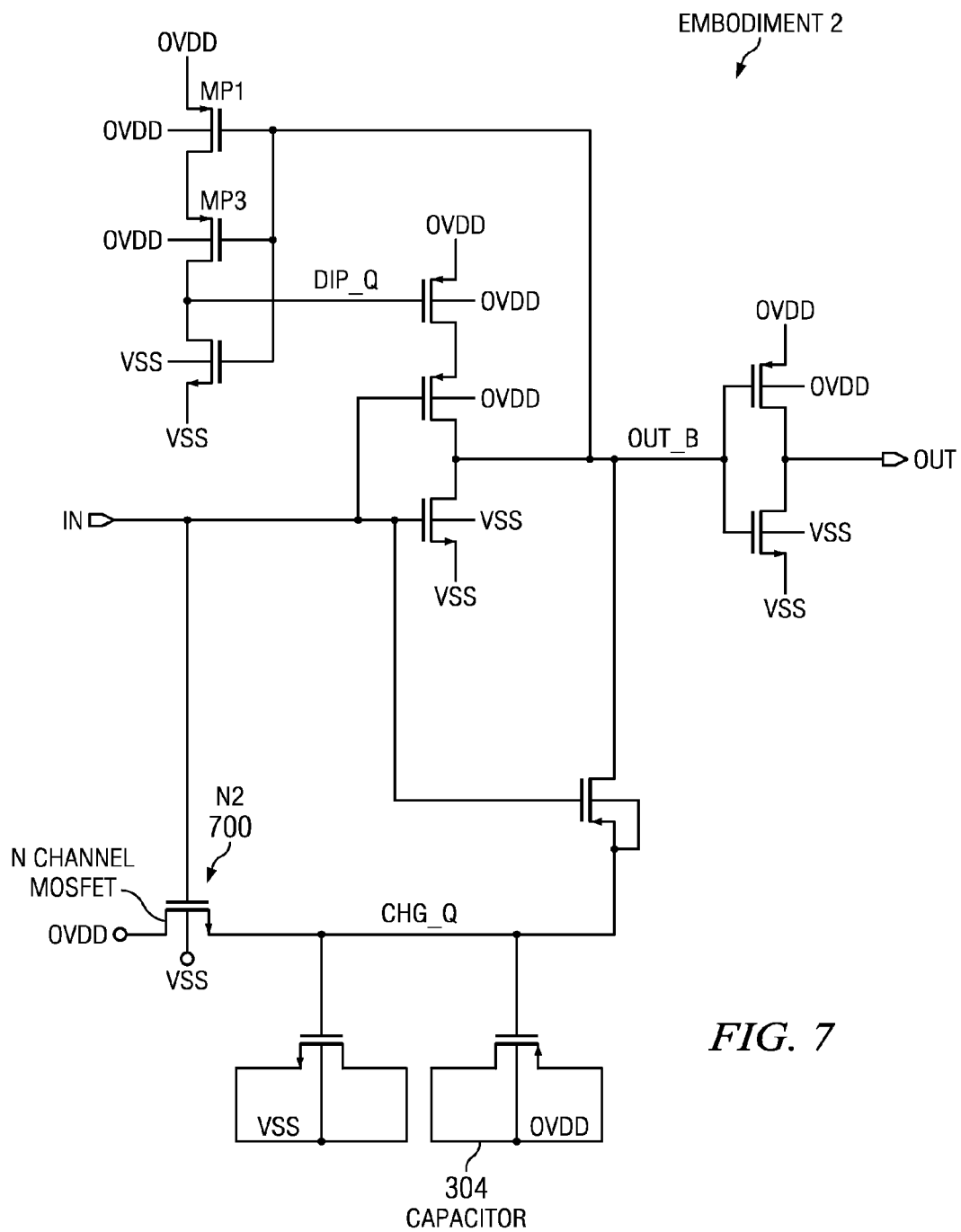
FIG. 7 is a schematic view illustrating P-channel MOSFET transistor as a resistor in the resistor circuit, according to one embodiment.

FIG. 7 is a schematic view illustrating P-channel MOSFET transistor 700 as a resistor in the resistor circuit, according to one embodiment. Particularly, FIG. 7 illustrates the P-channel MOSFET transistor 700, according to one embodiment.

The P-channel MOSFET transistor 700 may be configured to function as the resistor circuit 302 that may be coupled with the capacitor circuit 308 to eliminate unbuffered input.

In example embodiment, FIG. 7 is same as the FIG. 3, except the P-channel MOSFET transistor 700 that may be replaced by the resistor circuit 302 from the capacitor loop circuit 204.

In one embodiment, the resistor circuit 302 may be the p-channel MOSFET transistors 700 in series that may be configured to function as the resistor 306A-C. The resistance value of the p-channel MOSFET transistors 700 in series may be set to the specified value by scaling the width value to the length value of each of the p-channel MOSFET transistors 700.

Figure 8:
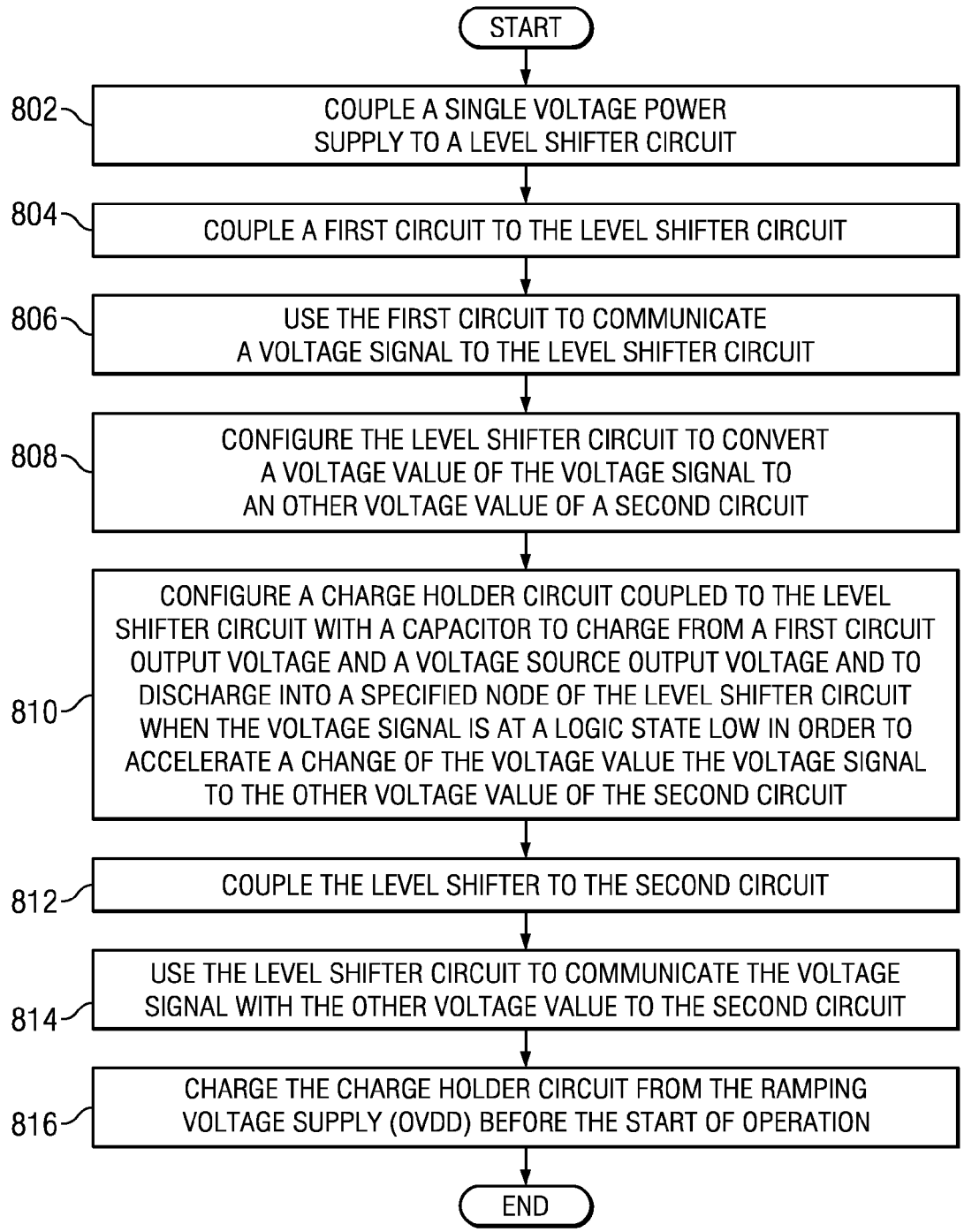
FIG. 8 is a process flow of coupling a single voltage power supply to a level shifter circuit, according to one embodiment.

FIG. 8 is a process flow of coupling a single voltage power supply (e.g., the voltage source 208 of FIG. 2) to a level shifter circuit (e.g., the level shifter circuit 200 of FIG. 2), according to one embodiment. In operation 802, a single voltage power supply may be coupled to the level shifter circuit 200. In operation 804, a first circuit (e.g., the first circuit 206 of FIG. 2) may be coupled to the level shifter circuit 200. In operation 806, the first circuit 206 may be used to communicate a voltage signal to the level shifter circuit 200. In operation 808, the level shifter circuit 200 may be configured to convert a voltage value of the voltage signal (e.g., may be input and/or output signal) to an other voltage value of a second circuit (e.g., the second circuit 210 of FIG. 2).

In operation 810, a charge holder circuit (e.g., the capacitor circuit 308 of FIG. 3) coupled to the level shifter circuit 200 may be configured with a capacitor (e.g., the capacitor 304 of FIG. 3) to charge from a first circuit output voltage and a voltage source output voltage and to discharge into a specified node of the level shifter circuit 200 when the voltage signal may be at a logic state low (e.g., as illustrated in FIG. 5) in order to accelerate a change of the voltage value the voltage signal to the other voltage value of the second circuit 210. In operation 812, the level shifter may be coupled (e.g., using the level shifter circuit 200 of FIG. 2) to the second circuit 210. In operation 814, the level shifter circuit 200 may be used to communicate the voltage signal with the other voltage value to the second circuit 210.

A single power voltage supply may be the second circuit 210. The charge holder circuit may include a resistor circuit (e.g., the resistor circuit 302 of FIG. 3) in series with a capacitor circuit (e.g., the capacitor circuit 308 of FIG. 3). The capacitor circuit 308 may include a p-channel metal-oxide-semiconductor field-effect transistor (MOSFET) (e.g., the p-channel metal-oxide-semiconductor field-effect transistor (MOSFET) 700 of FIG. 7) configured to function as the capacitor 304 and an n-channel MOSFET transistor (e.g., the n-channel MOSFET transistor 600 of FIG. 6) configured to function as the capacitor 304. The resistor circuit 302 may be the p-channel MOSFET transistors 700 in series configured to function as a resistor (e.g., the resistor 306A-C of FIG. 3). The resistor circuit 302 may be an other n-channel MOSFET transistor. The second circuit 210 may be coupled to the other n-channel MOSFET transistor located in the charge holder circuit in order to eliminate an unbuffered signal from the first circuit 206.

In operation 816, the capacitor 304 may be charged from the ramping voltage supply (e.g., OVDD) before the start of operation.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated (ASIC) circuitry and/or in Digital Signal Processor (DSP) circuitry).

Particularly, the semiconductor integrated circuit 100, the power supply routing circuit 106A-N, the level shifter circuit 200, the capacitor loop circuit 204, the first circuit 206, the second circuit 210, the resistor circuit 302, and the capacitor circuit 308 may be enabled using software and/or using transistors, logic gates, and electrical circuits (e.g., application specific integrated ASIC circuitry) and other circuit.

In addition, it will be appreciated that the various operations, processes, and methods disclosed herein may be embodied in a machine-readable medium and/or a machine accessible medium compatible with a data processing system (e.g., a computer system), and may be performed in any order (e.g., including using means for achieving the various operations). Accordingly, the specification and drawings are to be regarded in an illustrative rather than a restrictive sense.

What is claimed is:

1. A system comprising:
   a first circuit operative for transmitting a first voltage value;
   a second circuit for receiving a second voltage value;
   a voltage source with an output voltage equal to the second voltage value;
   a level shifter circuit coupled to the first circuit and the second circuit, wherein the level shifter circuit is used to convert the first voltage value to the second voltage value; and
   a capacitor loop circuit associated with the first circuit, the level shifter circuit and the voltage source, the capacitor loop circuit configured with a capacitor to charge from at least one of the first voltage value and the output voltage and to discharge into a specified node of the level shifter circuit when a first output signal associated with the first voltage value is at a logic state low.

2. The system of claim 1 wherein the capacitor loop circuit is comprised of a resistor circuit in series with a capacitor circuit.

3. The system of claim 2 wherein the capacitor circuit is comprised of at least one of a p-channel metal-oxide-semiconductor field-effect transistor (MOSFET) configured to function as the capacitor and an n-channel MOSFET transistor configured to function as the capacitor.

4. The system of claim 3 wherein the capacitor circuit contains a plurality of capacitors in parallel.

5. The system of claim 3:
   wherein the resistor circuit is a plurality of p-channel MOSFET transistors in series configured to function as a resistor, and
   wherein a resistance value of the plurality of p-channel MOSFET transistors in series is set to a specified value by scaling a width value to a length value of each of a p-channel MOSFET transistors.

6. The system of claim 3 wherein the resistor circuit is an other n-channel MOSFET transistor.

7. The system of claim 6 wherein the voltage source is coupled to the other n-channel MOSFET transistor in order to eliminate an unbuffered signal from the first circuit.

8. The system Of claim 1 wherein the voltage source is the second circuit.

9. The system of claim 1 wherein the level shifter circuit is comprised of:
   a complementary metal-oxide-semiconductor (CMOS) inverter coupled with an other CMOS inverter and wherein a CMOS inverter is coupled with the first circuit and the voltage source and the other CMOS inverter is coupled with the second circuit and the voltage source, and
   a capacitor control circuit coupled with both the capacitor loop circuit and the voltage source to charge the capacitor circuit of the capacitor loop circuit to the voltage value of the second circuit when the output signal of the first circuit is at the logic state low.

10. The system of claim 1:
    wherein the capacitor of the capacitor loop circuit discharges the first circuit output voltage into the level shifter circuit when a first circuit output voltage value is higher than a second circuit voltage value; and
    wherein the capacitor of the capacitor loop circuit discharges the voltage source output voltage into a level shifter when the first circuit output voltage value is less than the second circuit voltage value.

11. A method of a level shifter comprising:
coupling a single voltage power supply to a level shifter circuit;
coupling a first circuit to the level shifter circuit;
using the first circuit to communicate a first voltage value to the level shifter circuit;
configuring the level shifter circuit to convert the first voltage value to a second voltage value, wherein the second voltage value is equal to an output voltage of a voltage source;
configuring a charge holder circuit coupled to the level shifter circuit with a capacitor to charge from at least one of the first voltage value and output voltage and to discharge into a specified node of the level shifter circuit when a first voltage signal associated with the first voltage value is at a logic state low in order to accelerate a change of the first voltage value to the the second voltage value;
coupling the level shifter to the second circuit; and
using the level shifter circuit to communicate the second voltage value to the second circuit.

12. The method of claim 11 wherein a single power voltage supply is the second circuit.

13. The method of claim 11 wherein the charge holder circuit is comprised of a resistor circuit in series with a capacitor circuit.

14. The method of claim 13 wherein the capacitor circuit is comprised of at least one of a p-channel metal-oxide-semiconductor field-effect transistor (MOSFET) configured to function as the capacitor and an n-channel MOSFET transistor configured to function as the capacitor.

15. The method of claim 13 wherein the resistor circuit is a plurality of p-channel MOSFET transistors in series configured to function as a resistor.

16. The method of claim 13 wherein the resistor circuit is an other n-channel MOSFET transistor.

17. The method of claim 16 wherein the second circuit is coupled to the other n-channel MOSFET transistor located in the charge holder circuit in order to eliminate an unbuffered, signal from the first circuit.

18. The method of claim 11 further comprising discharging the capacitor into the specified node of the level shifter circuit during a ramp up phase of the level shifter circuit in order to decrease a duration of the ramp up phase.

* * * * *